US009424951B2

(12) United States Patent
Leung et al.

(10) Patent No.: US 9,424,951 B2
(45) Date of Patent: Aug. 23, 2016

(54) DYNAMIC STATIC RANDOM ACCESS MEMORY (SRAM) ARRAY CHARACTERIZATION USING AN ISOLATED BIT-LINE

(71) Applicant: Synopsys, Inc., Mountain View, CA (US)

(72) Inventors: Raymond Tak-Hoi Leung, Palo Alto, CA (US); Tzong-Kwang Henry Yeh, Los Gatos, CA (US); Shih-Yao Christine Sun, San Jose, CA (US); Jamil Kawa, Campbell, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/461,319

(22) Filed: Aug. 15, 2014

(65) Prior Publication Data

US 2015/0063009 A1 Mar. 5, 2015

Related U.S. Application Data

(60) Provisional application No. 61/870,769, filed on Aug. 27, 2013.

(51) Int. Cl.
*G11C 29/50* (2006.01)
*G11C 11/41* (2006.01)

(52) U.S. Cl.
CPC .............. *G11C 29/50* (2013.01); *G11C 11/41* (2013.01); *G11C 2029/5002* (2013.01)

(58) Field of Classification Search
CPC .......... G11C 11/41; G11C 2029/5002; G11C 29/50; G11C 2029/50
USPC .................................................. 365/154–156
See application file for complete search history.

(56) References Cited

U.S. PATENT DOCUMENTS

| | | | |
|---|---|---|---|
| 6,693,838 B2 | 2/2004 | Hagura et al. | |
| 7,379,339 B2 * | 5/2008 | Paparisto | G11C 29/1201 365/185.21 |
| 7,409,305 B1 | 8/2008 | Carpenter et al. | |
| 7,447,054 B2 | 11/2008 | Abella et al. | |
| 7,483,322 B2 | 1/2009 | Joshi et al. | |
| 7,518,927 B2 * | 4/2009 | Chung | G11C 16/28 365/154 |
| 7,626,852 B2 | 12/2009 | Houston | |
| 7,675,781 B2 | 3/2010 | Deml et al. | |
| 8,947,911 B1 * | 2/2015 | Chen | G11C 11/419 365/154 |

(Continued)

OTHER PUBLICATIONS

J. Tsai, et al., "SRAM Stability Characterization Using Tunable Oscillators in 45nm CMOS", Solid-State Circuits Conference Digest of Technical Papers (ISSCC), 2010 IEEE International /Session 19/High-Performance Embedded Memory/19.7, Feb. 7, 2010, pp. 354-355.

(Continued)

*Primary Examiner* — Vanthu Nguyen
*Assistant Examiner* — Khamdan Alrobaie
(74) *Attorney, Agent, or Firm* — HIPLegal LLP; Judith Szepesi

(57) ABSTRACT

A sensor circuit is used to provide bit-cell read strength distribution of an SRAM array. A current-mirror circuit mirroring the bit-line current of an SRAM array is used to power the sensor circuit. A reference current representing nominal bit-cell read current is used as a reference. The current-mirror circuit senses the bit-line current. The current-mirror and the ring oscillator are not part of the bit-line read path.

19 Claims, 8 Drawing Sheets

(56) References Cited

U.S. PATENT DOCUMENTS

| | | | |
|---|---|---|---|
| 9,082,514 B1 | 7/2015 | Trimberger | |
| 2005/0146965 A1* | 7/2005 | Kim | G11C 5/147 365/211 |
| 2006/0198226 A1* | 9/2006 | Takahashi | G11C 11/406 365/222 |
| 2007/0103242 A1* | 5/2007 | Wu | H03K 3/0322 331/57 |
| 2007/0237013 A1* | 10/2007 | Ng | G11C 29/50004 365/201 |
| 2010/0296329 A1 | 11/2010 | Summerfelt et al. | |
| 2010/0322026 A1* | 12/2010 | Jain | G11C 11/413 365/203 |
| 2013/0039139 A1 | 2/2013 | Raval et al. | |
| 2013/0176767 A1 | 7/2013 | Brooks | |
| 2014/0129884 A1* | 5/2014 | Hess | G11C 29/50012 714/721 |
| 2015/0063010 A1* | 3/2015 | Kawa | G11C 29/06 365/154 |
| 2015/0086775 A1 | 3/2015 | Allen et al. | |
| 2015/0228357 A1 | 8/2015 | Arsovski et al. | |

OTHER PUBLICATIONS

Z. Guo, et al., "Large-Scale SRAM Variability Characterization in 45 nm CMOS SRAM Arrays," Symposium on VLSI Circuits, Jun. 2008, pp. 42-43.

* cited by examiner

DYNAMIC STATIC RANDOM ACCESS MEMORY (SRAM) ARRAY CHARACTERIZATION USING AN ISOLATED BIT-LINE

RELATED APPLICATIONS

The present application claims priority to U.S. Provisional Patent No. 61/870,769, filed on Aug. 27, 2013, and incorporates that application by reference in its entirety.

FIELD

The present invention relates generally to memory design evaluation circuits, and more particularly to a memory circuit having a sensor circuit that accurately reflects internal read timing of a memory cell in near real time.

BACKGROUND

The trend for the need of larger and faster SRAMs operating at lower supply voltage continues to dominate system design progression. SRAMs are used in are used in processor caches with frequencies reaching 4 GHz. SRAM access time, dominated by bit-line loading and bit-cell read current is a critical parameter.

The bit-line impedance and the bit-cell read strength follow an intra-chip distribution that must be taken into account in SRAM design to ensure reasonable yield of electronic components that meet all the system speed requirements expected of an SRAM. Therefore knowledge of the distribution of bit-cell read time dominated by bit-line impedance and bit-cell read current is critical for SRAM design. This criticality increases with SRAM array size.

Prior art methods for the dynamic characterization of the read time and read current of SRAM bit-cells utilize ring oscillators and pulse stretching circuitry in the path of the bit-line/bit-cell combination read path.

BRIEF DESCRIPTION OF THE FIGURES

The present invention is illustrated by way of example, and not by way of limitation, in the figures of the accompanying. The novel features believed characteristic of the invention are set forth in the claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DETAILED DESCRIPTION

Figure 1:
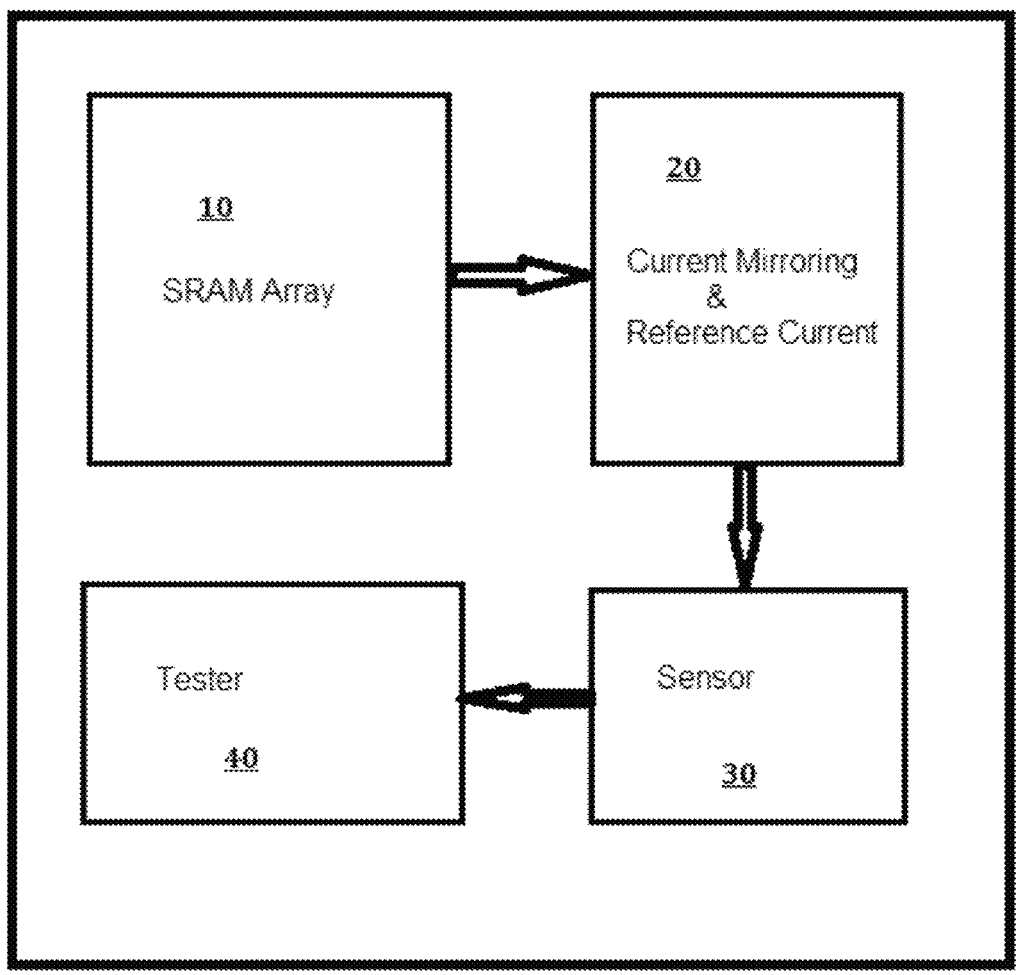
FIG. 1 is a block diagram of one embodiment of the system to characterize an SRAM array.

The present invention concerns a test circuit for dynamically evaluating read strength and read timing of static memory cells in a static random access memory array (SRAM array) in order to enhance the design and yield of SRAMs through knowing the distribution of read current in an array of a particular size. The circuit in one embodiment utilizes a current mirror to feed a ring oscillator, and does not put any of the testing circuitry inline with the bit-line/bit-cell read path.

The objective of accurately determining storage cell read timing and read strength/read current is accomplished in a method and circuit. In one embodiment, the circuit includes a current mirror circuit that accurately duplicates the read current of a bit-line discharged through a selected bit-cell. The mirrored current powers a sensor circuit, which in one embodiment is a ring oscillator. The frequency of the oscillator is a representation of the mirrored current, and therefore the SRAM read current. The frequency and amplitude of the output of the oscillator characterizes the SRAM array, by being dependent on the storage cell read timing and read strength/read current.

A reference current representing nominal simulated read current is used to power the ring oscillator to establish a reference frequency. In one embodiment, the SRAM bit-cells are dynamically selected one at a time via the word-lines of the SRAM array. The current mirror circuit duplicates for each bit-line/bit-cell read operation the read current flowing the bit-line/bit-cell. In one embodiment, the current mirror duplicating the read current of the selected bit-cell is multiplexed with the reference current during array testing. The output of the multiplexer is input to the ring oscillator. The frequency of the ring oscillator is measured, in one embodiment directly by a tester, or through a counter. Each frequency measurement of a read cycle represents the read current of the bit-line/bit-cell path. The distribution of the oscillator frequency mimics the distribution of the read current of the SRAM array.

The read delay of an SRAM is directly related to the read delay of a single bit-cell in an SRAM array. The read delay is measured by accessing a bit-cell by enabling the proper bit-line and word-line for selecting that bit-cell. The bit-line associated with the enabled bit-cell is discharged through the pass-transistor and the pull-down of the bit-cell. The speed of discharge which is a function of the bit-line parasitics and the read current strength of the bit-cell is a measure of the read delay.

This circuit allows the dynamic measuring of the read current of each bit-cell of an array without interfering with the normal loading and operation of the SRAM array. This circuit also minimizes the error in measurement introduced by existing schemes that involve circuitry in the path of the measured bit-cell current.

The system, in one embodiment, includes a current mirror circuit mirroring the bit-line current and using the mirrored current source to drive a ring oscillator. The frequency of the ring oscillator is a measure of the read current of a selected bit-cell.

FIG. 1 is a block level representation of the system. The system includes an SRAM array 10 to be tested. The SRAM array 10 is coupled to a current mirror 20. The current mirror 20 mirrors an IRead current of the SRAM array 10. The output of the current mirroring and reference current circuit 20 is input to sensor circuit 30. The sensor circuit 30 is driven by the mirrored current from current mirroring circuit 20. In one embodiment, sensor circuit 30 is a ring oscillator. The output of the sensor circuit 30 is coupled to a tester 40, to measure the output of sensor 30 which is used to characterize the SRAM array 10. The tester 40 reflects the SAM array read current in nearly real-time.

Figure 2A:
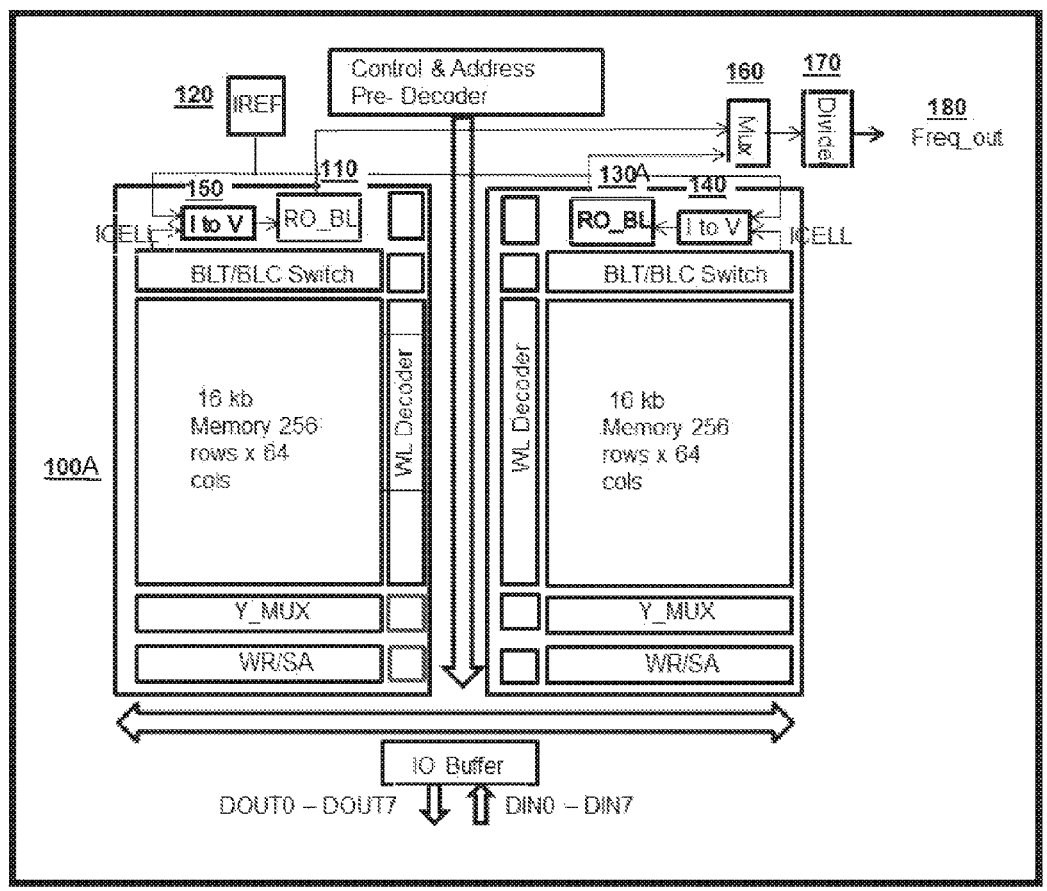
FIGS. 2A, 2B and 2C are circuit diagrams of embodiments of an SRAM array and characterization circuitry.

FIG. 2A is a block-level architectural diagram of an exemplary 32K bit SRAM array. A typical SRAM memory architecture 100A with multiple banks (here it is two banks of 16kb each, organized as 256 words by 64 columns), word-line decoders, bit-line switches, and I/O buffers is shown. Elements 110A through 180 are representative blocks of one embodiment of the invention. Ring oscillators 110A and 130A are identical ring oscillator blocks supporting the two banks of the SRAM array.

In one embodiment, a current mirror 140 and a current to voltage converter 150 are coupled to the SRAM 100A. The current mirror 140 senses the current of a bit-line. The bit-line current is converted to a voltage by a current to voltage converter 150, and that voltage powers one of the ring oscillators 110A, 130A.

In one embodiment, a reference bit-cell current Iref 120 is also converted to a voltage, by current mirror 140 and current to voltage converter 150, to drive the same ring oscillator 110A, 130A to establish a reference frequency. The reference frequency is used as a baseline for the evaluation of the frequency of the ring oscillator 110A, 130A driven by the bit-line mirrored current. By driving the same ring oscillator 110A, 130A by the reference current Iref 120, any effects of variations between ring oscillators 110A, 130A is eliminated.

In one embodiment, the reference current value, Iref 120, is established by a reference circuit based on the simulation of the nominal bit-line parasitics and nominal bit-cell drive current.

The current to voltage converter 150 is used in one embodiment. In another more basic embodiment, the mirrored-current circuit as well as the reference current Iref 120 drive the ring oscillator 110A or 130A directly.

Multiplexer 160 represents a multiplexing block between the outputs of the ring oscillators 110A and 130A supporting the main two banks of the SRAM array. In one embodiment, the circuit also includes a divider 170. Divider 170 is a divide by "n" circuit for the multiplexed output of the ring oscillator output to make the sensed frequency 180 easier to measure by a generic tester. The number "n" is arbitrary, and a typical number is 8. In another embodiment, the system may use direct sensing of frequency 180. In another embodiment, the frequency 180 is input to a counter. Other methods of evaluating the frequency 180 may be utilized.

Figure 2B:
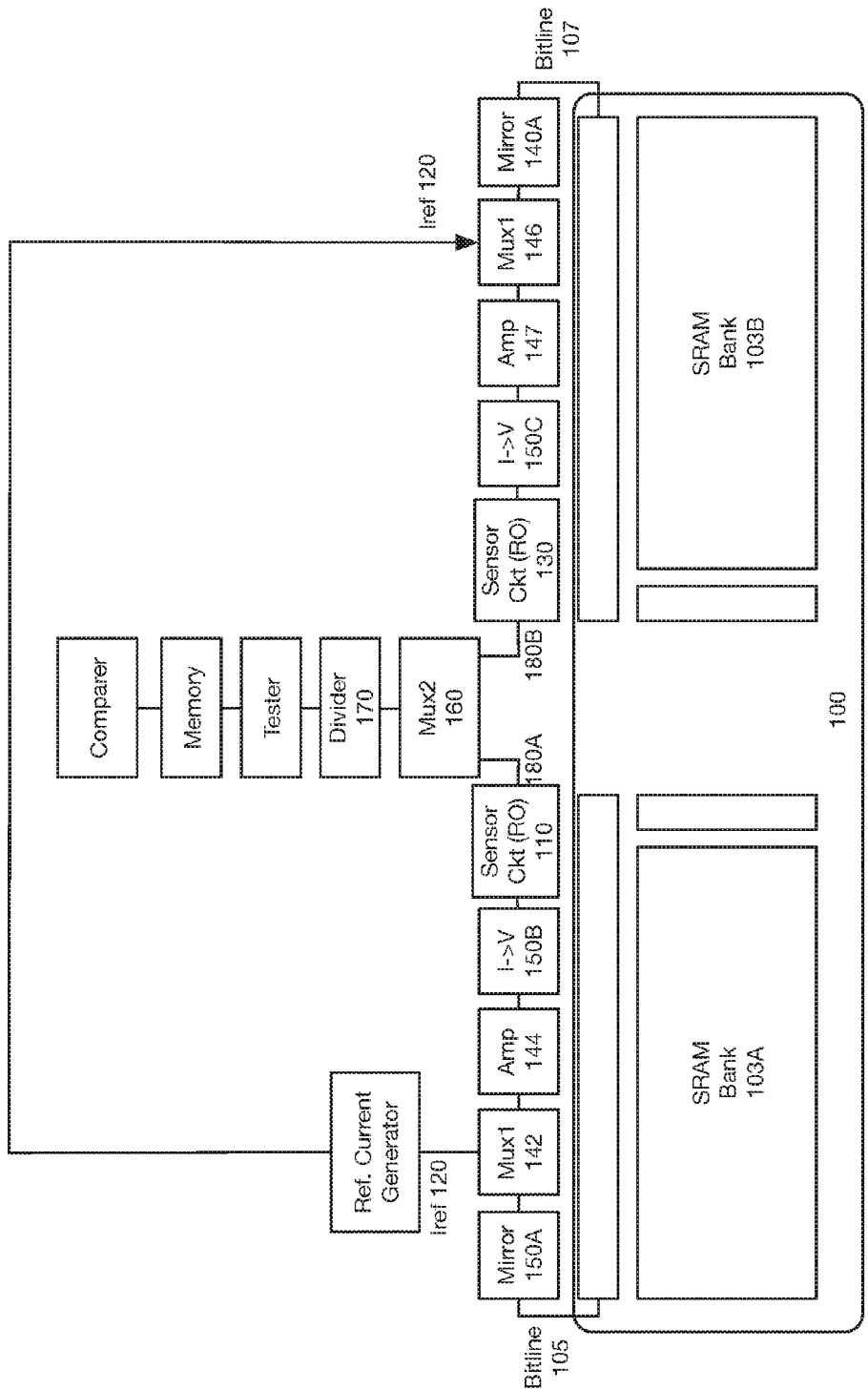

FIG. 2B is a block-level architectural diagram of an exemplary 32K bit SRAM array and sensor circuit in accordance with one embodiment of the present invention. A typical SRAM memory architecture 100 with multiple banks (here it is two banks of 16kb each, SRAM Banks 103A and 103B, organized as 256 words by 64 columns), word-line decoders, bit-line switches, and I/O buffers as shown. Elements 110 through 170 are representative blocks of one embodiment of the invention. Ring oscillators 110 and 130 are identical ring oscillator blocks supporting the SRAM Banks 103A and 103B of the SRAM array.

In one embodiment, current mirror 150A and current to voltage converter 150B are coupled to the SRAM memory architecture 100. The current mirror 150A senses the current of a bit-line 105 and produces a mirrored bit-line current without being part of the bit-line read path. The mirrored bit-line current from current mirror 150A is converted to a voltage by a current to voltage converter 150B, and that voltage powers ring oscillator 110. Ring oscillator 110 produces a frequency 180A that may be sensed. The frequency of ring oscillator 110 when measured in a read cycle, represents the read current of the bit-line / bit-cell path of the SRAM memory architecture 100 without being part of the bit-line read path. The distribution of the oscillator frequency of ring oscillator 110 mimics the distribution of the read current of the SRAM array.

In one embodiment, reference bit-cell circuit 120 produces a current Iref 120 which is also converted to a voltage by current to voltage converter 150B to drive the same ring oscillator 110 to establish a reference frequency. The reference frequency is used as a baseline for the evaluation of the frequency of the ring oscillator 110 to be compared to the frequency measured in a read cycle when driven by the bit-line mirrored current from current mirror 150A. By driving the same ring oscillator 110 with both the reference current Iref from reference bit-cell circuit 120 as well as the mirrored bit-line current from current mirror 150A, any effects of variations between multiple ring oscillators is eliminated. The reference current Iref and the reference frequency of the oscillator with the input of Iref is used as a base for measurement and comparison, for example, between ring oscillators 110 and 130. In one embodiment, the current mirror 150A duplicating the read current of the selected bit-cell is multiplexed by multiplexer 142 with the reference current Iref during array testing. The output of the multiplexer 142 is input to the ring oscillator 110.

In one embodiment, the Iref and mirrored bit-line current from current mirror 150A are each amplified by a factor of "m" in amplifier 144 to make the spread of the sensed oscillator frequency 180A more pronounced and easier to measure. In one embodiment, the reference current value, Iref 120, is established by the reference bit-cell circuit based on the simulation of the nominal bit-line parasitics and nominal bit-cell drive current.

Figure 2C:
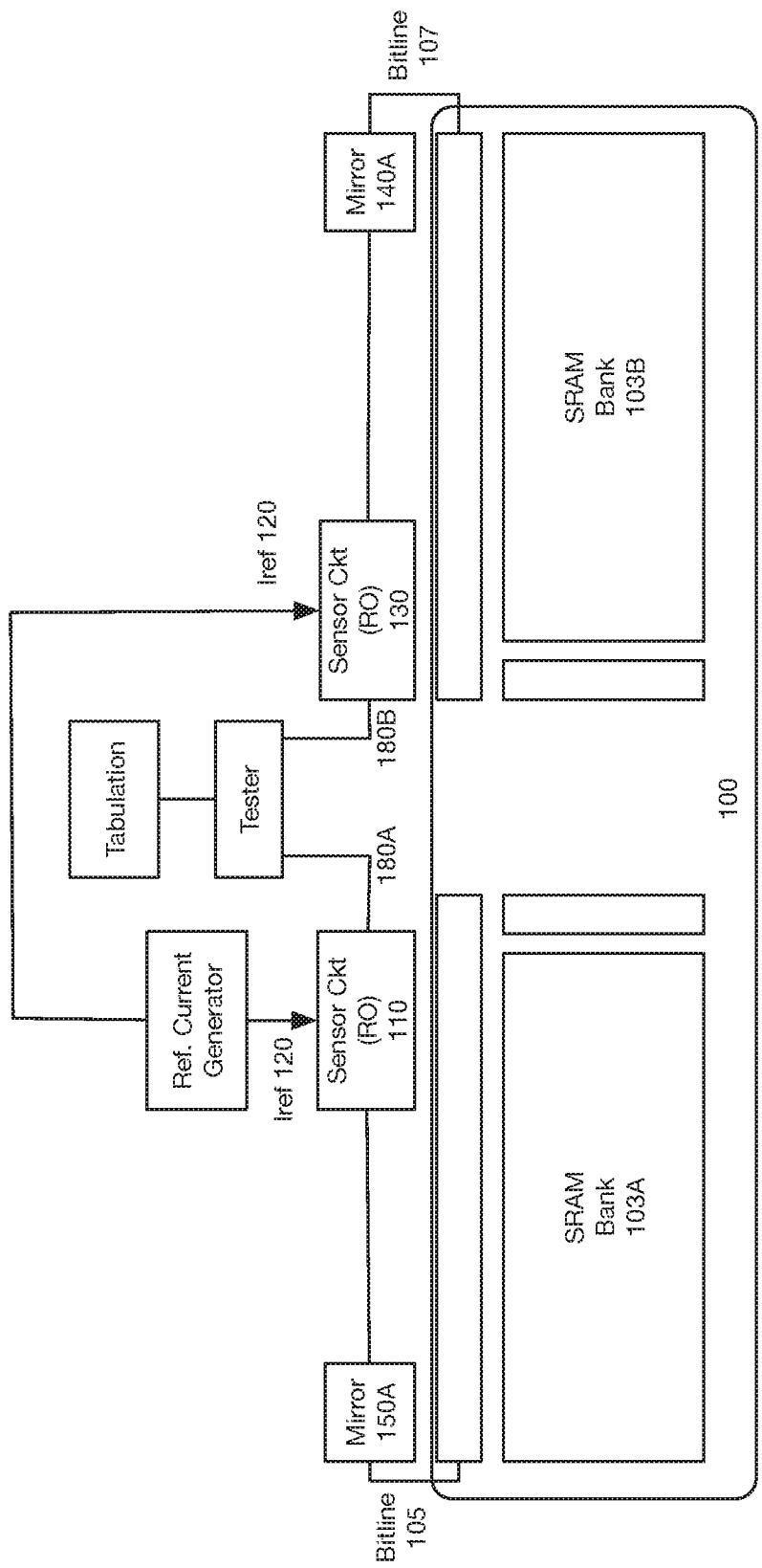

The current to voltage converter 150B is used in one embodiment. Similar elements current mirror 140A, multiplexer 146, amplifier 147, current to voltage converter 150C and ring oscillator 130 may be used to in similar combinations to create a frequency 180B that may be sensed. In another more basic embodiment, as shown in FIG. 2C, a mirrored-current circuit current mirror 140A that mirrors bit-line current 107 as well as a reference current Iref 120 drive a ring oscillator 130 directly. Similarly, in another more basic embodiment, as shown in Fiq. 2C, a mirrored-current circuit current mirror 150A that mirrors bit-line current 105 as well as a reference current Iref 120 drive a ring oscillator 110 directly.

In FIG. 2B, multiplexer 160 represents a multiplexing block between the outputs of the ring oscillators 110, producing frequency 180A, and 130, producing frequency 180B, supporting the SRAM banks 103A and 103B of the SRAM array. In one embodiment, the circuit also includes a divider 170. Divider 170 is a divide by "n" circuit for the multiplexed output of the ring oscillators output to make the sensed frequencies 180A and 180B easier to measure by a generic tester. The number "n" is arbitrary, and a typical number is 8. In another embodiment, the system may use direct sensing of frequencies 180A and 180B. In another embodiment, the frequencies 180A and 180B are input to a counter. Other methods of evaluating the frequencies 180A and 180B may be utilized. The reference current Iref and the reference frequency of the oscillator with the input of Iref may be stored as a base for measurement and used for comparison. Thus, any differences between ring oscillators 110 and 130 in the measurement of the mirrored bit-line currents may be known by comparing each base for measurement with the actual measurement.

Figure 3:
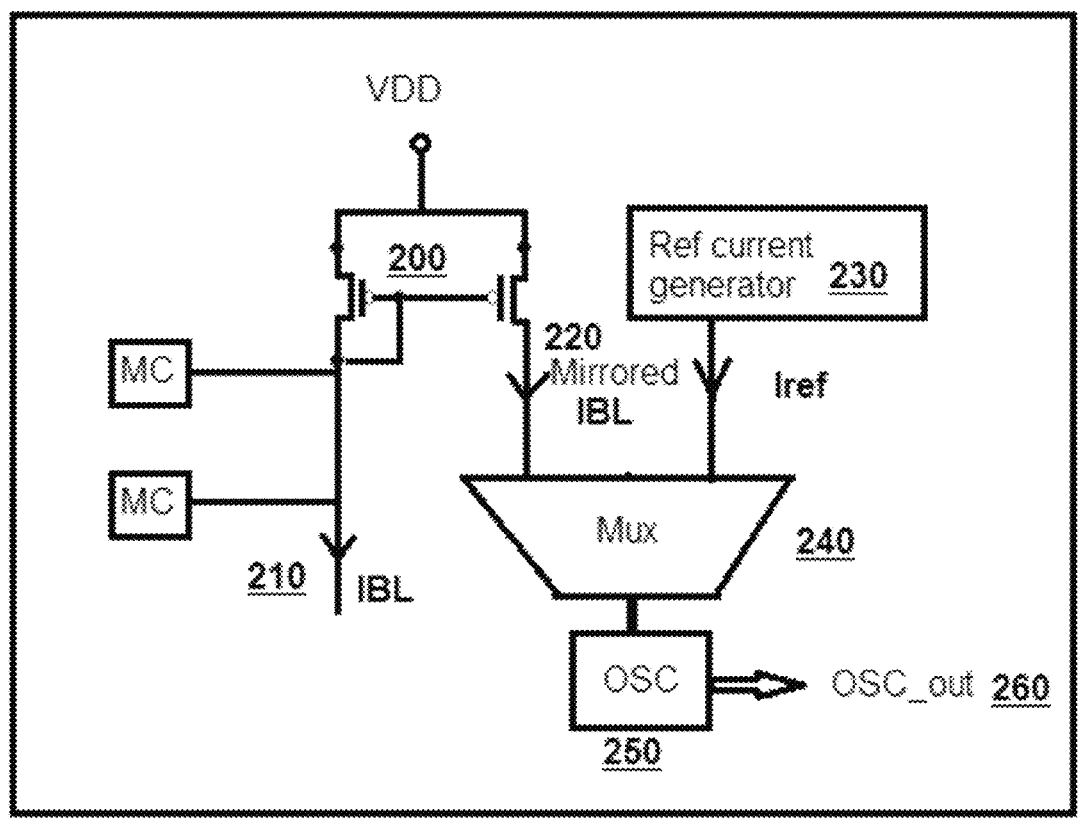
FIG. 3 is a circuit diagram of one embodiment of the invention.

FIG. 3 is a circuit diagram of one embodiment of the invention. A classical current-mirror circuit 200 generates a mirrored isolated bit-lined current (IBL) 220. Mirrored IBL 220 equals IBL current 210. A reference current generator 230 generates Iref, reflecting the simulated Iread of a typical SRAM bit-cell under nominal conditions. The Iref is used to establish a reference oscillator frequency to Iread (IBL) conversion. In one embodiment, multiplexer 240 is used to multiplex the Iref from reference current generator 230 with mirrored IBL 220 to enable the same ring oscillator 250 to be used used for establishing the reference frequency of as well as the measured frequencies from the ring oscillator 250. The output 260 of the ring oscillator 250 is sensed. In one embodiment, the output 260 is sensed directly. In another embodiment, the output 260 is sensed after a divide-by circuit, or through a counter. Such sensing techniques are well established in the art and are not relevant to the invention.

Figure 4:
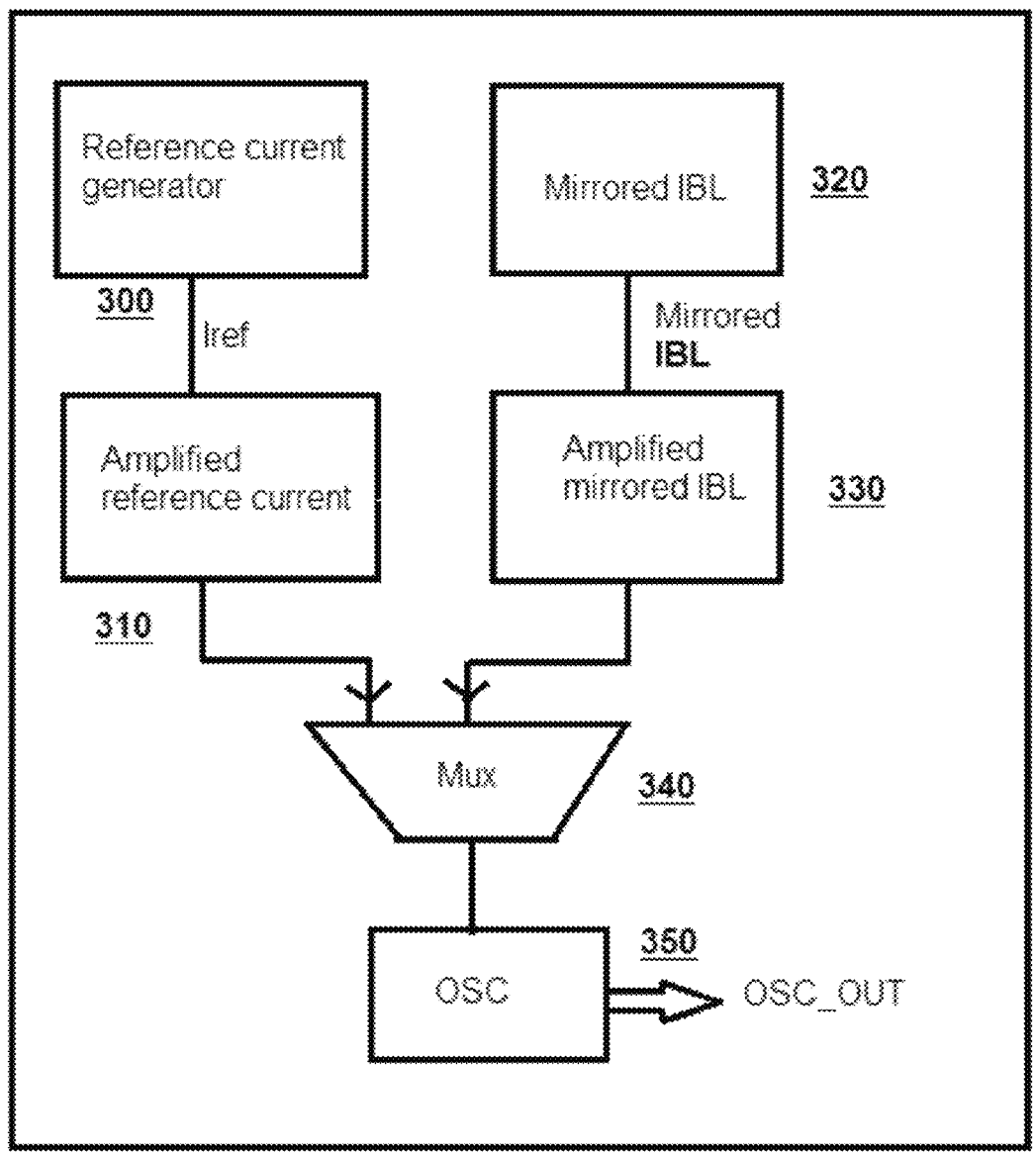
FIG. 4 is a circuit diagram of another embodiment of the invention.

FIG. 4 is a block diagram of one embodiment of the system. In this embodiment, the reference current Iref is generated in generator 300, and the mirrored IBL is generated in mirrored IBL generator 320. The Iref and mirrored IBL are each amplified by a factor of "m" in amplifiers 310 and 330 respectively, to make the spread of the sensed oscillator frequency 350 more pronounced and easier to measure. In one embodiment, the amplification factor "m" is 4. The signal output by the amplifiers 310, 330 is input to a MUX 340 in one embodiment. The MUX 340 output is then supplied as the current source for the oscillator 350.

Figure 5:
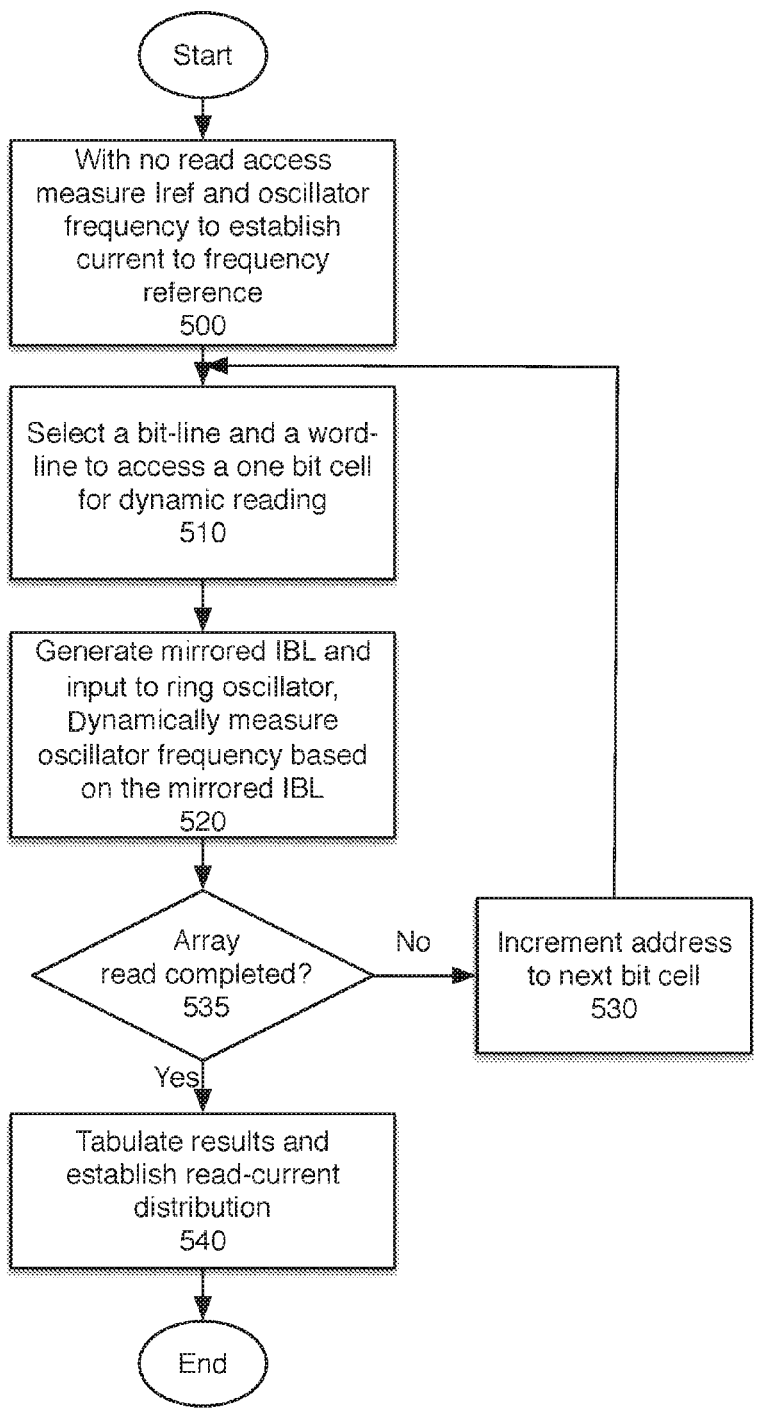
FIG. 5 is a flowchart of one embodiment of the testing cycle.

Referring now to FIG. 5, a flowchart of one embodiment of a typical test sequence is described. At block 500 the process establishes the reference current Iref and the reference frequency of the oscillator with the input of Iref, as a base for measurement and comparison.

At block 510, an address is asserted resulting in a selected bit-line and a selected word-line translating to a bit-line discharging through a bit-cell. This bit-cell is dynamically read. At block 520 a mirrored IBL is generated and input to the ring oscillator, whose oscillation frequency is measured. The changes in the oscillation frequency reflect the difference between the baseline, measured with the input of Iref, and the Icell (the current through the selected bit-line and word-line) without direct access to Icell. In one embodiment, the output of the oscillator is measured using a counter.

The procedure is repeated for the next bit-cell through incrementing the address, at block 530, until the selected bits and bit-line/bit Iread instances are characterized. In one embodiment, the results are tabulated 540 and Iread distribution is established.

The results are used to characterize the SRAM array. The bit-line impedance and the bit-cell read strength can be evaluated based on the tabulated results, and be used to characterize the SRAM. This characterization can then be used as part of a model of the SRAM array, which provides the timing, power requirements, and characteristics of the SRAM array. The collection of such models may be referred to as a library. The model from the library can be used in circuit design, to ensure that the timing and power requirements of the SRAM are met in the design. The characterization can also be used in SRAM design, to ensure reasonable yield of electronic components that meet all the system speed requirements expected of an SRAM.

One of ordinary skill in the art will recognize that the process is a conceptual representation of the operations used to characterize an SRAM array. The specific operations of the process may not be performed in the exact order shown and described. The specific operations may not be performed in one continuous series of operations, and different specific operations may be performed in different embodiments. Furthermore, the process could be implemented using several sub-processes, or as part of a larger macro process.

Figure 6:
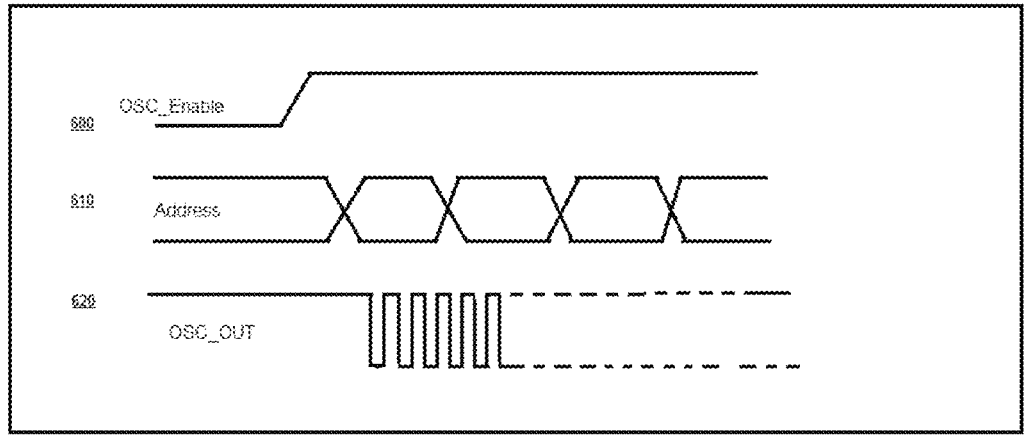
FIG. 6 is a timing diagram, showing a typical relationship between SRAM addressing and sensor circuit.

FIG. 6 is a timing diagram of one embodiment of the circuit. The OSC_Enable signal 600, enabling the ring oscillator, is asserted before any active word-line (WL) address is selected. The oscillator output 620 until a WL address is asserted reflects the oscillator frequency of the reference current Iref (not shown here). Each asserted address 610 represents a selected bit-line/word-line combination (a selected bit) and the oscillator output OSC_OUTR 620 sensed during each active address is the proxy of the read current for the selected bit-line/bit.

Figure 7:
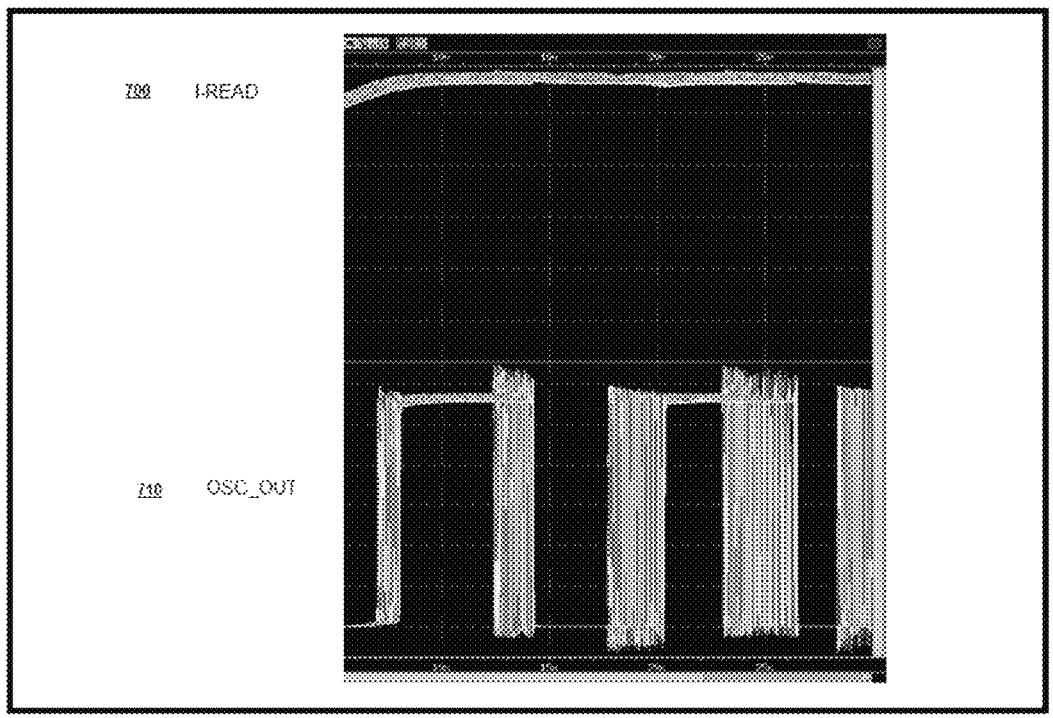
FIG. 7 is an exemplary simulation output of the I-read and oscillator output distribution of an SRAM array.

FIG. 7 shows the output of the ring oscillator, using a simulator. The simulation representation of an Iread distribution 700 and oscillator frequency distribution 710 show the slight shifts, as new bit-line/word-line selections are made, and compared to the reference frequency.

While the invention has been particularly shown and described with reference to the preferred embodiment thereof, it will be understood by those skilled in the art that the foregoing and other changes in form, and details may be made therein without departing from the spirit and scope of the invention.

We claim:

1. A circuit comprising: a static random access memory (SRAM) array including a bit-line;
   a current mirror to create a mirrored isolated bit-line (MIBL) current, based on a bit-line read current in an active bit-cell of the SRAM array, the active bit-cell of the SRAM array having a read path; and
   a sensor circuit including an output, the output of the sensor circuit characterizing the SRAM array when powered by the MIBL, wherein the sensor circuit is not inline with the read path;
   wherein the sensor circuit is a ring oscillator.

2. The circuit of claim 1, wherein an oscillator frequency of the ring oscillator scales with the MIBL current.

3. The circuit of claim 1, wherein the sensor circuit is not directly coupled to the bit-line in the SRAM array.

4. The circuit of claim 1, further comprising a current to voltage converter, to convert the MIBL current to a voltage, the voltage driving the sensor circuit.

5. The circuit of claim 1, further comprising:
   a multiplexing circuit selecting between a reference bit-line (RBL) current and the MIBL current;
   the output of the sensor circuit further characterizing a baseline reference of the SRAM array under nominal conditions when powered by the RBL.

6. The circuit of claim 5, where the RBL current and the MIBL currents are amplified before powering the sensor circuit.

7. A method of stress testing a static random access memory (SRAM) array comprising:
   establishing a reference oscillator frequency using a reference bit-line (RBL) current;
   accessing bit cells in the SRAM array sequentially to produce a bit-line current;
   creating a mirrored isolated bit-line (MIBL) current; and
   measuring a measured oscillator frequency based on the MIBL current for each accessed bit-cell, and comparing the measured oscillator frequency to the reference oscillator frequency, wherein the measuring is done through one of: directly, through a counter, through a multiplexer, or through a divider, and wherein the oscillator frequency measurement is not inline with a read path of the SRAM array.

8. The method of claim 7, further comprising: multiplexing the RIBL and the MIBL to enable using the same oscillator circuit for measurement of the oscillator frequency.

9. The method of claim 7, wherein the measured oscillator frequency of the oscillator scales with the bit-line current.

10. The method of claim 7, wherein the oscillator is not directly coupled to a bit-line in the SRAM array.

11. The method of claim 7, further comprising:
converting the MIBL current to a voltage, the voltage driving the oscillator, the oscillator providing the measured oscillator frequencies.

12. The method of claim 7, further comprising:
multiplexing the RBL current and the MIBL current.

13. The method of claim 7, further comprising:
amplifying the RBL current and the MIBL current before powering the oscillator, the oscillator being a ring oscillator providing the reference oscillator frequency and the measured oscillator frequencies.

14. The method of claim 7, further comprising:
calculating characterization information for the SRAM array based on the measured oscillator frequency;
adding the characterization information of the SRAM array to a library, the library used in circuit design.

15. A circuit comprising:
an SRAM array including a bit-line having a bit-line current used as a read current, the bit-line having a read path for the SRAM array;
a current mirror circuit to create a mirrored isolated bit-line (MIBL) current, based on the bit-line current in an active bit-cell of the SRAM array;
a current to voltage converter to convert the MIBL current to a voltage;
a ring oscillator powered by the voltage, an output of the ring oscillator characterizing the SRAM array, wherein the current to voltage converter and the ring oscillator are not inline with the read path.

16. The circuit of claim 15, wherein an oscillator frequency of the ring oscillator scales with the bit-line current.

17. The circuit of claim 15, wherein the ring oscillator is not directly coupled to the bit-line in the SRAM array.

18. The circuit of claim 15, further comprising:
a multiplexer having as inputs a reference bit-line (RBL) current and the MIBL current.

19. The circuit of claim 15, further comprising:
an amplifier to amplify the RBL current and the MIBL current before powering the ring oscillator.

* * * * *